United States Patent
Srinivasan et al.

(10) Patent No.: US 11,727,186 B2
(45) Date of Patent: Aug. 15, 2023

(54) AUTOMATIC IDENTIFICATION OF HIERARCHICAL CELLS BASED ON SELECTED PROPERTIES FOR LAYOUT VERIFICATION

(71) Applicant: Siemens Industry Software Inc., Plano, TX (US)

(72) Inventors: Sridhar Srinivasan, Tualatin, OR (US); Sherif Hany Riad Mohammed Mousa, Beaverton, OR (US); Padmaja Susarla, McLean, VA (US)

(73) Assignee: Siemens Industry Software Inc., Plano, TX (US)

( * ) Notice: Subject to any disclaimer, the term of this patent is extended or adjusted under 35 U.S.C. 154(b) by 164 days.

(21) Appl. No.: 17/241,694

(22) Filed: Apr. 27, 2021

(65) Prior Publication Data
US 2021/0383051 A1 Dec. 9, 2021

Related U.S. Application Data

(60) Provisional application No. 63/035,921, filed on Jun. 8, 2020.

(51) Int. Cl.
*G06F 30/398* (2020.01)

(52) U.S. Cl.
CPC ................................ *G06F 30/398* (2020.01)

(58) Field of Classification Search
CPC .... G06F 30/398; G06F 30/392; G06F 30/394; G06F 30/39; G06F 30/367; G06F 2119/12; G06F 2119/06; G06F 30/30; G06F 30/327; G06F 30/3323; G06F 2111/04; G06F 30/33; G06F 2111/12; G06F 2115/08; G06F 30/20; G06F 30/3308; G06F 30/36; G06F 2111/20; G06F 2119/02; G06F 30/3312; G06F 2115/10; G06F 2119/18; G06F 30/333; G06F 30/373; G06F 16/211; G06F 16/245; G06F 2113/04; G06F 2201/80; G06F 30/00; G06F 30/31; G06F 30/331; G06F 30/337; G06F 11/322; G06F 2117/10; G06F 2119/10; G06F 30/27; G06F 30/3315; G06F 30/3953; G06F 12/0811; G06F 12/0815; G06F 12/0831; G06F 12/109; G06F 12/128; G06F 13/161; G06F 13/1668; G06F 13/28; G06F 13/4068; G06F 15/17368; G06F 15/7807; G06F 2212/305; G06F 2212/657; G06F 30/38; G03F 1/30;
(Continued)

(56) References Cited

U.S. PATENT DOCUMENTS

| 6,931,613 B2 | 8/2005 | Gibson et al. |
| 10,360,331 B2 | 7/2019 | Hofmann |

(Continued)

*Primary Examiner* — Binh C Tat

(57) ABSTRACT

A circuit design in a hierarchical description is analyzed. The analysis comprises identifying electrical properties of circuit blocks in the circuit design. Circuit components of the circuit design are associated with geometric elements of a layout design. Then instances of each of the circuit blocks are classified into groups of instances based on the electrical properties. Rule checking is performed on one or more groups in the groups of instances for each of the circuit blocks by analyzing geometric elements associate with components of one instance for each of the one or more groups.

17 Claims, 5 Drawing Sheets

Flow chart 400

(58) Field of Classification Search
CPC ..... G03F 1/36; G03F 1/68; G03F 1/78; H01L 27/0207; H01L 2027/11875; H01L 2224/4943; H01L 2027/11881; H01L 2924/00014; H01L 2924/14; H01L 21/823431; H01L 23/5226; H01L 2027/11866; H01L 24/49
USPC .................................................. 716/110–116
See application file for complete search history.

(56) References Cited

U.S. PATENT DOCUMENTS

| | | |
|---|---|---|
| 10,596,219 B2 | 3/2020 | Srinivasan |
| 10,885,258 B1* | 1/2021 | Chiou ................... G06F 30/398 |
| 2016/0275228 A1* | 9/2016 | Tskitishvili ........... G06F 30/392 |
| 2020/0104457 A1* | 4/2020 | Chuang ................ G06F 30/327 |

* cited by examiner

Flow chart 400

AUTOMATIC IDENTIFICATION OF HIERARCHICAL CELLS BASED ON SELECTED PROPERTIES FOR LAYOUT VERIFICATION

RELATED APPLICATIONS

This application claims the benefit of U.S. Provisional Patent Application No. 63/035,921, filed on Jun. 8, 2020, titled "Automatic Identification of Hierarchical Cells Based on Selected Properties for Layout Verification," and naming Sridhar Srinivasan et al. as inventors, which applications are incorporated entirely herein by reference.

FIELD OF THE DISCLOSED TECHNOLOGY

The present disclosed technology relates to integrated circuit design and process technologies. Various implementations of the disclosed technology may be particularly useful for reliability verification of a circuit design.

BACKGROUND OF THE DISCLOSED TECHNOLOGY

Reliability verification helps ensure the robustness of an integrated circuit design by considering the context of schematic and layout information to perform checks against various electrical and physical design rules that reduce susceptibility to premature or catastrophic electrical failures, usually over time. With consumer expectations for longer device operation at sustained performance levels, designing for reliability is no longer an optional product feature, but a necessary and integral part of a product's specifications. Traditional verification tools handle either the physical verification of the layout shapes or the electrical verification of the circuits, but not both. Context-aware checks can combine the physical layout of a component with its electrical implementation, and analyze that information to evaluate a wide range of design conditions.

The move to system-on-chip (SoC) designs has dramatically increased chip sizes. Circuit design having billions of transistors are not rare nowadays. To handle these large sizes and aggressive performance targets while getting designs to market faster, designers employ hierarchical or block-based design methodologies, which are based on the traditional divide-and-conquer paradigm. However, challenges remain for reliability verification tools to take advantage of the hierarchical data structure of a circuit design to speed up the verification process.

BRIEF SUMMARY OF THE DISCLOSED TECHNOLOGY

Various aspects of the present disclosed technology relate to techniques of reliability verification based on identifying hierarchical cells having selected properties. In one aspect, there is a method comprising: analyzing a circuit design, circuit components of the circuit design being associated with geometric elements of a layout design, the circuit design using a hierarchical description and comprising circuit blocks, the analyzing comprising identifying electrical properties of circuit blocks in the circuit design; classifying instances of each of the circuit blocks into groups of instances based on the electrical properties; and performing rule checking on one or more groups in the groups of instances for each of the circuit blocks by analyzing geometric elements associate with components of one instance for each of the one or more groups. The method may further comprise: modifying the circuit design based on results of the rule checking.

The electrical properties may comprise voltage values of input power for the circuit blocks. The rule checking may comprise electrostatic discharge (ESD) checking, electrical overstress (EOS) checking, signals crossing multiple power domains checking, or any combination thereof. The identifying electrical properties may comprise voltage propagation.

The one or more groups is selected based on a number of instances in each of the one or more groups, a number of locations in the one of the circuit blocks to be checked for violating the rule, or any combination thereof.

The one or more groups may be selected only when a product of a number of instances in each of the one or more groups and a number of locations in the one of the circuit blocks to be checked for violating the rule is greater than a preset number.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Figure 1:
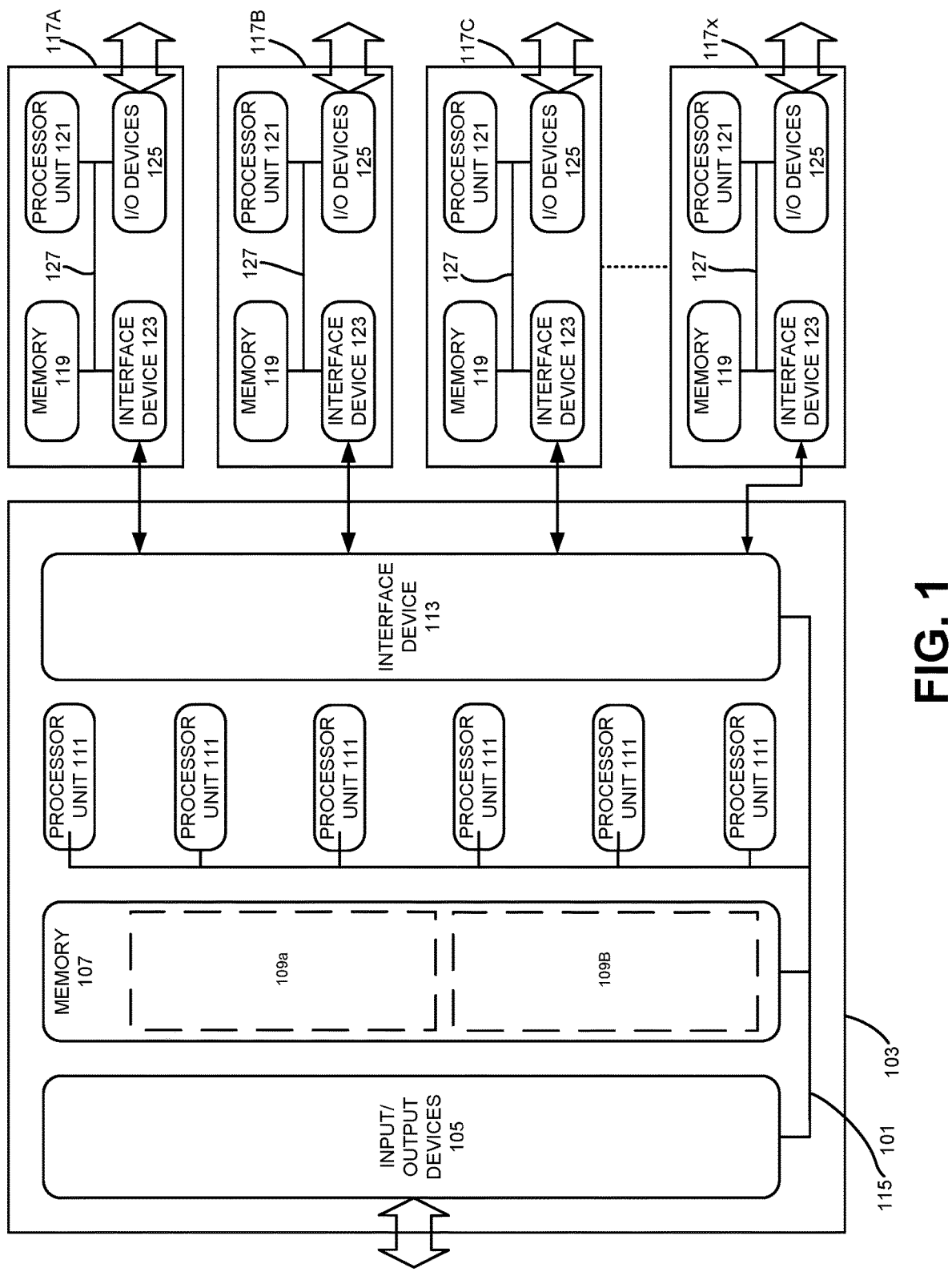
FIG. 1 illustrates an example of a computing system that may be used to implement various embodiments of the disclosed technology.

Various aspects of the present disclosed technology relate to techniques of reliability verification based on identifying hierarchical cells having selected properties. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "classify", "analyze", and "perform" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
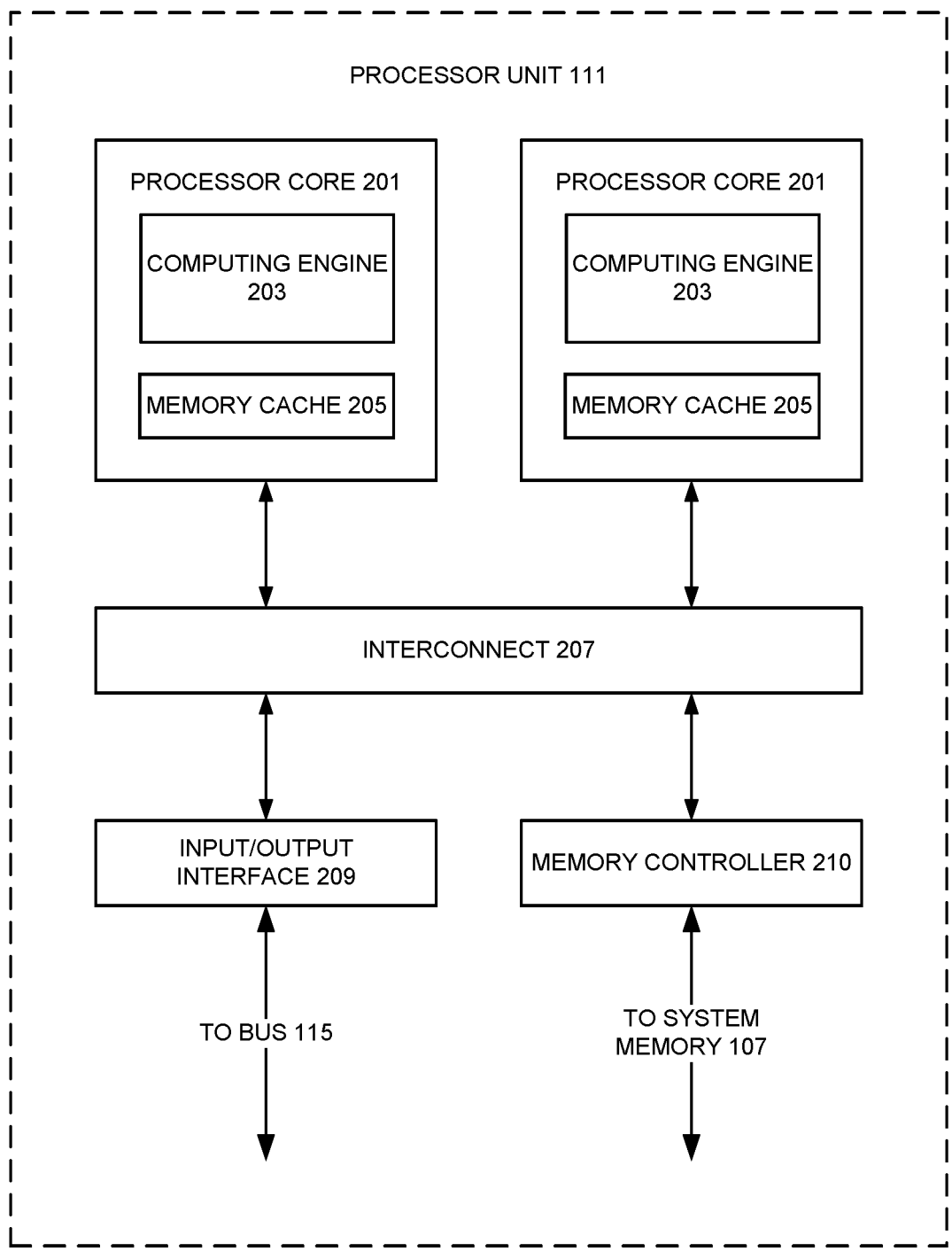
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Design Flow And Reliability Verification

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing circuit device components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

Process variations and technical limitations of the photolithography techniques can make it difficult or even impossible to print some layout features. To achieve a high overall yield and reliability for the design, the layout is measured by a set of geometric constraints, or design rules, specific to a particular photolithographic process before tapeout. Design rule checking is thus a major step during physical verification signoff on the design. Still further, the layout design may be modified to include the use of redundant geometric elements or the addition of corrective features to various geometric elements, to counteract limitations in the manufacturing process, etc. For example, the design flow process may include one or more resolution enhancement technique (RET) processes (e.g., optical proximity correction), that modify the layout design data to improve the usable resolution of the reticle or mask created from the design in a photolithographic manufacturing process.

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." For example, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells. Of course, while the above-described example is of design data organized hierarchically based upon circuit structures, circuit design data may alternately or additionally be organized hierarchically according to any desired criteria including, for example, a geographic grid of regular or arbitrary dimensions (e.g., windows), a memory amount available for performing operations on the design data, design element density, etc.

By categorizing microcircuit design data into hierarchical cells, large data structures can be processed more quickly and efficiently. For example, a circuit designer typically will analyze a design to ensure that each circuit feature described in the design complies with design rules specified by the foundry that will manufacture microcircuits from the design. With the above example, instead of having to analyze each feature in the entire 128 kB memory array, a design rule check process can analyze the features in a single bit cell. The results of the check will then be applicable to all of the single bit cells. Once it has confirmed that one instance of the single bit cells complies with the design rules, the design rule check process then can complete the analysis of a register cell simply by analyzing the features of its additional miscellaneous circuitry (which may itself be made up one or more hierarchical cells). The results of this check will then be applicable to all of the register cells. Once it has confirmed that one instance of the register cells complies with the design rules, the design rule check software application can complete the analysis of the entire 128 kB memory array simply by analyzing the features of the additional miscellaneous circuitry in the memory array. Thus, the analysis of a large data structure can be compressed into the analyses of a relatively small number of cells making up the data structure.

Circuit designs and layout designs are also reviewed for reliability issues caused by the electrical system. This is sometimes referred to as reliability verification. Reliability verification can include reviewing the design for protection from electrostatic discharge (ESD) events, detecting electrical overstress (EOS) situations, performing voltage-aware design rule checking (VDRC), or the like. Tools that can detect electrical overstress situations and perform voltage-aware design rule checking, often do so in a two-stage process—performing voltage propagation through the design, for example, at the schematic-level, and then comparing particular circuits in the design and their corresponding propagated voltages to various electric rules or design rules. Since reliability verification is typically performed without design simulation, i.e., without an understanding of electrical performance of the devices in the design, the tools often propagate a common voltage throughout the design, perform rule checking based on that common voltage, and determine a presence of electrical violations.

Reliability Verification Tool

Figure 3:
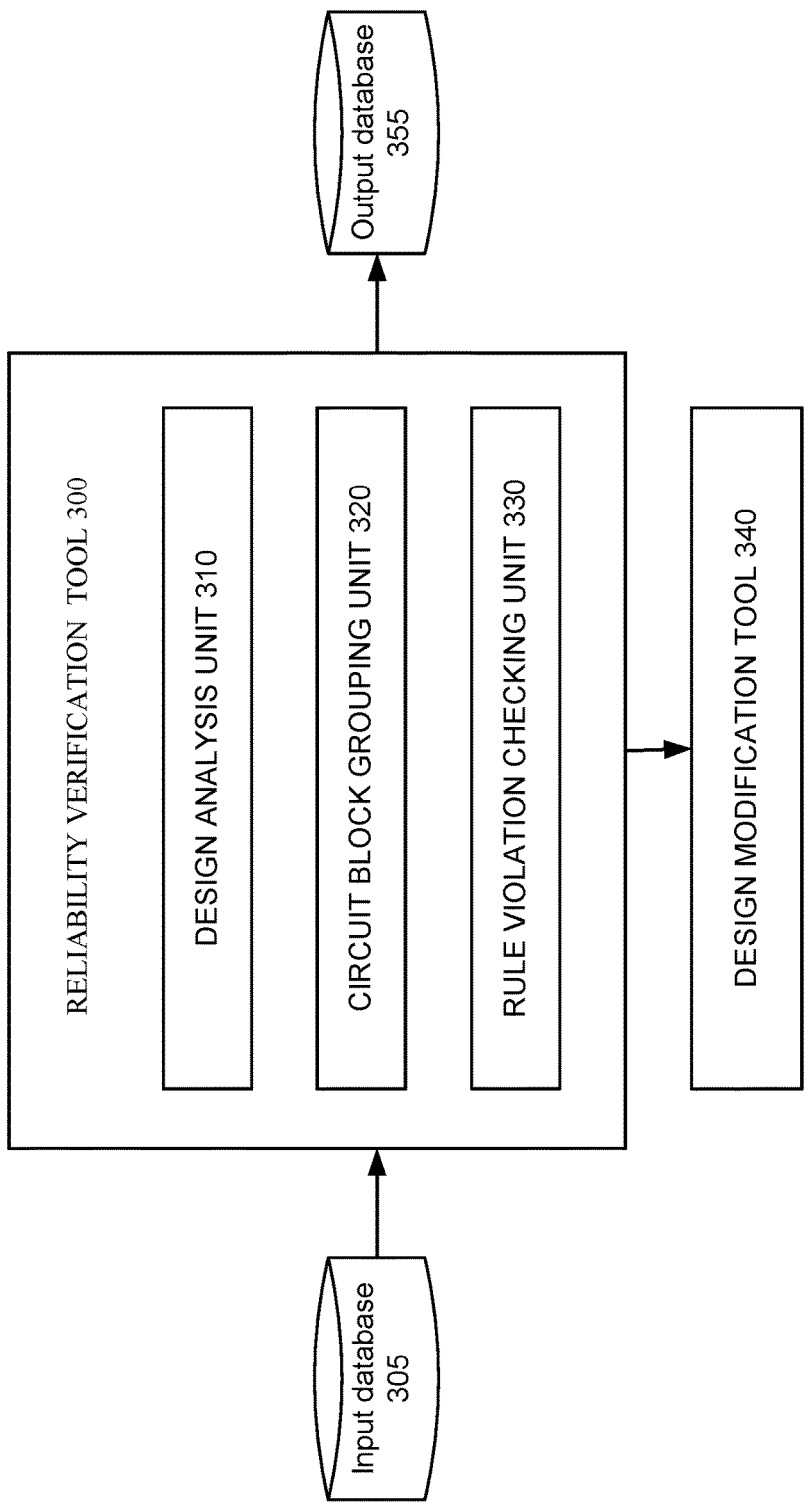
FIG. 3 illustrates an example of a reliability verification tool that may be implemented according to various embodiments of the disclosed technology.

FIG. 3 illustrates an example of a reliability verification tool 300 that may be implemented according to various embodiments of the disclosed technology. As seen in this figure, the reliability verification tool 300 includes a design analysis unit 310, a circuit block grouping unit 320, and a rule violation checking unit 330. Some implementations of the reliability verification tool 500 may cooperate with (or incorporate) one or more of a design modification unit 340, an input database 305 and an output database 355.

As will be discussed in more detail below, the reliability verification tool 300 can receive a circuit design from the input database 305. The design analysis unit 310 can analyze a circuit design. Components of the circuit design are associated with geometric elements of a layout design. The circuit design is in a hierarchical form and comprises circuit blocks. The analysis comprises identifying electrical properties of circuit blocks in the circuit design. The circuit block grouping unit 320 can classify instances of each of the circuit blocks into groups of instances based on the electrical properties. The rule violation checking unit 330 can perform rule checking process on one or more groups in the groups of instances for each of the circuit blocks by analyzing geometric elements associate with components of one instance for each of the one or more groups. The verification tool 300 can report the detected problems in the circuit design. The reporting may comprise storing in the output database 355 information about the detected problems. The design modification unit 340 can modify the circuit design to fix the detected problems.

As previously noted, various examples of the disclosed technology may be implemented by one or more computing systems, such as the computing system illustrated in FIGS. 1 and 2. Accordingly, one or more of the design analysis unit 310, the circuit block grouping unit 320, the rule violation checking unit 330 and the design modification unit 340 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the design analysis unit 310, the circuit block grouping unit 320, the rule violation checking unit 330 and the design modification unit 340. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the design analysis unit 310, the circuit block grouping unit 320, the rule violation checking unit 330 and the design modification unit 340 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Hierarchical Cell Identification for Reliability Verification

Figure 4:
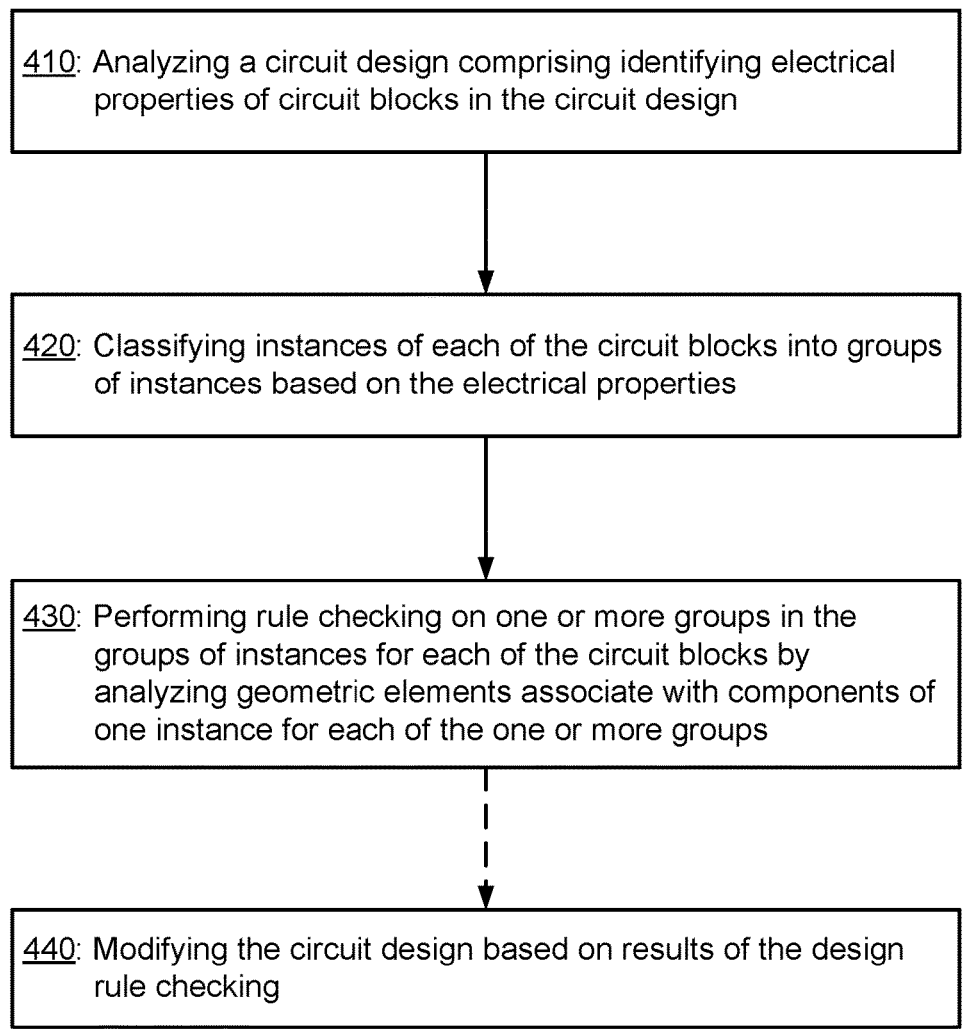
FIG. 4 illustrates a flowchart showing a process of reliability verification based on identifying hierarchical cells having selected properties that may be implemented according to various examples of the disclosed technology.
Figure 4:

FIG. 4 illustrates a flowchart 400 showing a process of reliability verification based on identifying hierarchical cells having selected properties that may be implemented according to various examples of the disclosed technology. For ease of understanding, methods of reliability verification based on identifying hierarchical cells having selected properties that may be employed according to various embodiments of the disclosed technology will be described with reference to the reliability verification tool 300 in FIG. 3 and the flow chart 400 illustrated in FIG. 4. It should be appreciated, however, that alternate implementations of a reliability verification tool 300 may be used to perform the methods of reliability verification based on identifying hierarchical cells having selected properties illustrated by the flow chart 400 according to various embodiments of the disclosed technology. Likewise, the reliability verification tool 300 may be employed to perform other methods of reliability verification based on identifying hierarchical cells having selected properties according to various embodiments of the disclosed technology.

In operation 310, the design analysis unit 310 analyzes a circuit design. The circuit design received by the reliability verification tool 300 from the input database 305 uses a hierarchical description. In the hierarchical description, the circuit design is viewed as a collection of component aggregates that are further divided into sub-aggregates in a recursive and hierarchical manner. These hierarchical units are commonly referred to as cells (or modules, blocks, macros, and so on); the use of a cell at a given level of hierarchy is called a cell instance. The use of a cell at some point in a circuit implies that the entire content of the cell's definition is present at that point in the final circuit. Multiple uses of a cell indicate that the cell contents are to be repeated at each use. This disclosure refers to a cell as a circuit block, and cell instances are called circuit block instances.

The circuit design can be in a form of a netlist. The netlist may be derived from a schematic design. The netlist can be considered as a textual analog of the schematic which is applicable and normally used for computer-aided processing and circuit equations formulating. A schematic graph itself may be derived from the schematic netlist. The netlist can be transformed into a layout design. Alternatively, the netlist may be one derived from the layout design. The derivation is typically performed in a layout verification process using a layout-versus-schematic (LVS) tool such as those in the Calibre family of software tools available from Siemens EDA, Wilsonville, Oreg.

The circuit components of the circuit design are associated with geometric elements of the layout design. The cross-reference information between logic identifiers and layout features may be generated using methods disclosed in U.S. patent application Ser. No. 13/017,788 (U.S. Publication Number US2011-0320990A1), which is incorporated herein by reference. The Calibre PERC tool in the Calibre family of software tools available from Siemens EDA, Wilsonville, Oreg. may be employed to perform the cross-referencing operation.

The analysis of circuit design performed by the design analysis unit 310 comprises identifying electrical properties of circuit blocks in the circuit design. The electrical properties may comprise voltage values of input power for a circuit block. Alternatively or additionally, the electrical properties may comprise may comprise current values of input power for a circuit block, the number of devices between the power pads of the circuit design and the power input ports of a circuit block, or both. A circuit block in the circuit design may have many instances. These instances, while having the same topology, can have different electrical properties.

Figure 5:
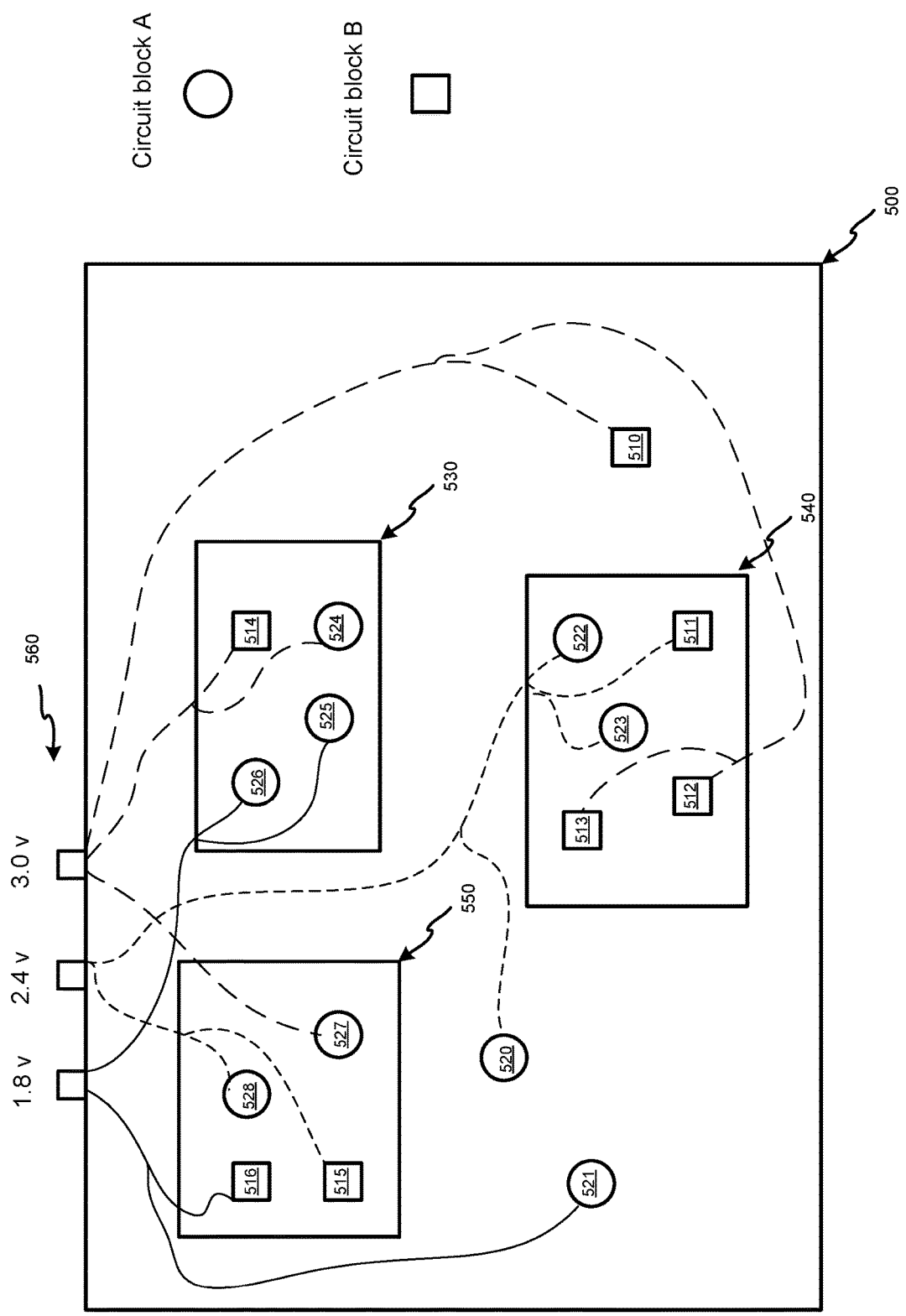
FIG. 5 illustrates an example of instances of circuit blocks in a circuit design having different input power voltage values.

FIG. 5 illustrates an example of instances of circuit blocks in a circuit design 500 having different input power voltage values. The circuit design 500 is represented by a hierarchical description, comprising composition circuit blocks 530, 540 and 550 and leaf circuit blocks 510-516 and 520-528. The circuit design 500 also has three power pads 560 as shown in the figure, supplying voltages of 1.8 volts, 2.4 volts and 3.0 volts, respectively. The leaf circuit blocks 514 and 524-526 are in the composition circuit block 530; the leaf circuit blocks 511-513 and 522-523 are in the composition circuit block 540; and the leaf circuit blocks 515-516 and 527-528 are in the composition circuit block 550. The circuit blocks 510-516 are instances of a circuit block B, and the circuit blocks 520-528 are instances of a circuit block A. Each of the instances of the circuit blocks A and B are coupled to one of the three different power supply pads 560.

Input power voltage values for a circuit block may be obtained through a voltage propagation process. Voltage propagation can be performed in a vectored mode (circuit input states provided), a vectorless mode (only power/ground rails provided), or a hybrid mode. In a vectorless mode, for example, transistors may be assumed to be turned on and voltage values are propagated directly across them. In some cases, voltage values can only be propagated across a transistor in one direction (e.g., only from one terminal connected directly to a power or ground rail). Nets connected to power supply or ground rails are a common example of break nets (i.e., nets to which voltage values are not propagated). A net is a conductor interconnecting two or more terminals of components of the circuit design. Other components like inductors or resistors may be treated as short connections while diodes and capacitors may be considered as open circuits. These rules may be set as default rules for vectorless voltage propagation. Users may provide rules for particular components of the circuit design. For example, users may specify that certain transistors should be assumed to be in an "off" state during the voltage propagation process.

Referring back to FIG. 4, in operation 420, the circuit block grouping unit 320 classifies instances of each of the circuit blocks into groups of instances based on the electrical properties. The circuit block grouping unit 320 may group together the instances of a circuit black having the same value of a particular electrical property. For example, In FIG. 5, the instances 521 and 525-526 of the circuit block A receiving 1.8 volt of power supply are grouped together; the instances 520, 522-523 and 528 of the circuit block A receiving 2.4 volt of power supply are grouped together; and the instance 524 and 527 of the circuit block A receiving 3.0 volt of power supply are grouped together. Similarly, the instances 510 and 512-514 of the circuit block B receiving 3.0 volt of power supply are grouped together; the instances 511 and 515 of the circuit block B receiving 2.4 volt of power supply are grouped together; and the instance 516 of the circuit block B receiving 1.8 volt of power supply is itself in a separate group.

The circuit block grouping unit 320 may classify the instances of a circuit black having values of a particular electrical property within a certain range. For example, In FIG. 5, any instances of a particular circuit block having power supply values equal to 3.0 volt and less than 3.0 volt can be grouped into two different groups. For the circuit block A, the instances 524 and 527 are grouped together while the instances 520-523, 525-526 and 528 are grouped together. For the circuit block B, the instances are classified into a first group including the instances 510 and 512-514 and a second group including the instances 511 and 515-516.

Referring back to FIG. 4, in operation 430, the rule violation checking unit 330 performs rule checking on one or more groups in the groups of instances for each of the circuit blocks by analyzing geometric elements associate with components of one instance for each of the one or more groups. The rule checking can comprise conventional design rule checking (DRC). Additionally or alternatively, the rule checking can comprise may comprise electrical rule checking such as electrical rule checking comprises electrostatic discharge (ESD) checking, electrical overstress (EOS) checking, or signals crossing multiple power domains checking.

With the knowledge of the electrical properties, the rule violation checking unit 330 can use slightly different rules for checking on different instance groups for the same circuit block. For example, allowable parasitic resistance values can be different for the instances 521 and 525-526 of the circuit block A vs. the instances 520, 522-523 and 528 of the circuit block A vs. the instance 524 and 527 of the circuit block A in FIG. 5 due to their different power supply voltage values.

In some applications, the rule violation checking unit 330 may perform rule checking only on one or more groups in the groups of instances of one of the circuit blocks based on a rule for electrical rule checking and the electrical properties. For example, the circuit block group selection unit 330 may select groups of instances having input power voltage values above a preset number (e.g., at or above 3.0 v). This may be due to the fact that the higher the input power voltage value, the more vulnerable to electrical reliability problems the circuit. In the example shown in FIG. 5, the circuit block group selection unit 330 may select the group comprising the instances 524 and 527 for the circuit block A and the group comprising the instances 510 and 512-514 for the circuit block B. Additionally or alternatively, the rule violation checking unit 330 may select the one or more groups for rule checking based on the number of instances in each of the one or more groups, the number of locations in the one of the circuit blocks to be checked for violating the rule, or both. One example of the selection criteria is the product of a number of instances in the one or more groups and a number of locations in the one of the circuit blocks to be checked for violating the rule being greater than a preset number.

Preserving the hierarchical description, the rule violation checking unit 330 can analyze geometric elements associate with components of just one instance for each of the one or more groups. The result is applicable to the rest of the group. For instance, a violation detected from the one instance can mean all of the instances in the group have the same violation. This can greatly speed up the verification process.

Optionally, in operation 440, the design modification unit 340 can modify the circuit design or the layout design to fix the detected problems.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
   analyzing a circuit design, circuit components of the circuit design being associated with geometric elements of a layout design, the circuit design using a hierarchical description and comprising circuit blocks, the analyzing comprising identifying electrical properties of circuit blocks in the circuit design, the electrical properties comprising voltage values of input power for a circuit block, current values of input power for a circuit block, a number of devices between power pads of the circuit design and power input ports of a circuit block, or any combination thereof;
   classifying instances of each of the circuit blocks into groups of instances based on the electrical properties; and performing rule checking on one or more groups in the groups of instances for each of the circuit blocks by analyzing geometric elements associate with components of one instance for each of the one or more groups.

2. The method recited in claim 1, further comprising: modifying the circuit design based on results of the rule checking.

3. The method recited in claim 1, wherein the rule checking comprises electrostatic discharge (ESD) checking, electrical overstress (EOS) checking, signals crossing multiple power domains checking, or any combination thereof.

4. The method recited in claim 1, wherein the identifying electrical properties comprises voltage propagation.

5. The method recited in claim 1, wherein the one or more groups is selected based on a number of instances in each of the one or more groups, a number of locations in the one of the circuit blocks to be checked for violating the rule, or any combination thereof.

6. The method recited in claim 1, wherein the one or more groups is selected only when a product of a number of instances in each of the one or more groups and a number of locations in the one of the circuit blocks to be checked for violating the rule is greater than a preset number.

7. One or more non-transitory computer-readable media storing computer-executable instructions for causing one or more processors to perform a method, the method comprising:
analyzing a circuit design, circuit components of the circuit design being associated with geometric elements of a layout design, the circuit design using a hierarchical description and comprising circuit blocks, the analyzing comprising identifying electrical properties of circuit blocks in the circuit design, the electrical properties comprising voltage values of input power for a circuit block, current values of input power for a circuit block, a number of devices between power pads of the circuit design and power input ports of a circuit block, or any combination thereof;
classifying instances of each of the circuit blocks into groups of instances based on the electrical properties; and
performing rule checking on one or more groups in the groups of instances for each of the circuit blocks by analyzing geometric elements associate with components of one instance for each of the one or more groups.

8. The one or more non-transitory computer-readable media recited in claim 7, wherein the method further comprises: modifying the circuit design based on results of the rule checking.

9. The one or more non-transitory computer-readable media recited in claim 7, wherein the rule checking comprises electrostatic discharge (ESD) checking, electrical overstress (EOS) checking, signals crossing multiple power domains checking, or any combination thereof.

10. The one or more non-transitory computer-readable media recited in claim 7, wherein the identifying electrical properties comprises voltage propagation.

11. The one or more non-transitory computer-readable media recited in claim 7, wherein the one or more groups is selected based on a number of instances in each of the one or more groups, a number of locations in the one of the circuit blocks to be checked for violating the rule, or any combination thereof.

12. The one or more non-transitory computer-readable media recited in claim 7, wherein the one or more groups is selected only when a product of a number of instances in each of the one or more groups and a number of locations in the one of the circuit blocks to be checked for violating the rule is greater than a preset number.

13. A system, comprising:
one or more processors, the one or more processors programmed to perform a method, the method comprising:
analyzing a circuit design, circuit components of the circuit design being associated with geometric elements of a layout design, the circuit design using a hierarchical description and comprising circuit blocks, the analyzing comprising identifying electrical properties of circuit blocks in the circuit design, the electrical properties comprising voltage values of input power for a circuit block, current values of input power for a circuit block, a number of devices between power pads of the circuit design and power input ports of a circuit block, or any combination thereof;
classifying instances of each of the circuit blocks into groups of instances based on the electrical properties; and
performing rule checking on one or more groups in the groups of instances for each of the circuit blocks by analyzing geometric elements associate with components of one instance for each of the one or more groups.

14. The system recited in claim 13, wherein the method further comprises: modifying the circuit design based on results of the rule checking.

15. The system recited in claim 13, wherein the rule checking comprises electrostatic discharge (ESD) checking, electrical overstress (EOS) checking, signals crossing multiple power domains checking, or any combination thereof.

16. The system recited in claim 13, wherein the identifying electrical properties comprises voltage propagation.

17. The system recited in claim 13, wherein the one or more groups is selected based on a number of instances in each of the one or more groups, a number of locations in the one of the circuit blocks to be checked for violating the rule, or any combination thereof.

* * * * *